(12) United States Patent
Zhao (10) Patent No.: US 11,315,833 B2
(45) Date of Patent: Apr. 26, 2022

(54) WAFER PROCESSING METHOD INCLUDING A TEST ELEMENT GROUP (TEG) CUTTING STEP

(71) Applicant: DISCO CORPORATION, Tokyo (JP)

(72) Inventor: Jinyan Zhao, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 315 days.

(21) Appl. No.: 16/446,258

(22) Filed: Jun. 19, 2019

(65) Prior Publication Data
US 2019/0393089 A1 Dec. 26, 2019

(30) Foreign Application Priority Data

Jun. 22, 2018 (JP) .............................. JP2018-119122

(51) Int. Cl.
| | |
|---|---|
| *H01L 21/46* | (2006.01) |
| *H01L 21/78* | (2006.01) |
| *B23K 26/364* | (2014.01) |
| *B23K 26/40* | (2014.01) |
| *H01L 21/683* | (2006.01) |
| *C09J 7/24* | (2018.01) |
| *H01L 21/304* | (2006.01) |

(52) U.S. Cl.
CPC ............ *H01L 21/78* (2013.01); *B23K 26/364* (2015.10); *B23K 26/40* (2013.01); *C09J 7/241* (2018.01); *H01L 21/3043* (2013.01); *H01L 21/6836* (2013.01); *H01L 2221/6834* (2013.01); *H01L 2221/68327* (2013.01)

(58) Field of Classification Search
CPC . H01L 21/3043; H01L 21/6836; H01L 21/77; H01L 21/78; H01L 21/302; H01L 21/304; H01L 21/67132; B23K 26/364; B23K 26/40; B23K 26/00; B23K 26/53; C09J 7/241

USPC ......................................................... 438/460
See application file for complete search history.

(56) References Cited

U.S. PATENT DOCUMENTS

2014/0206177 A1* 7/2014 Ogawa ................... B23K 26/40
438/462
2017/0047221 A1* 2/2017 Harada ............. H01L 21/02115

FOREIGN PATENT DOCUMENTS

| JP | 2002192370 | * | 7/2002 |
| JP | 2002192370 A | | 7/2002 |

* cited by examiner

*Primary Examiner* — Caleb E Henry
*Assistant Examiner* — Dilinh P Nguyen
(74) *Attorney, Agent, or Firm* — Greer Burns & Crain, Ltd.

(57) ABSTRACT

A wafer processing method includes a sheet bonding step of placing a polyolefin or polyester sheet on a front side of a wafer having a device area where devices are formed so as to be separated by division lines, the sheet having a size capable of covering the device area, and next performing thermocompression bonding to bond the sheet to the front side of the wafer, thereby protecting the front side of the wafer with the sheet. The method further includes a test element group (TEG) cutting step of applying a first laser beam through the sheet to the wafer along each division line thereby cutting a TEG formed on each division line, and a modified layer forming step of applying a second laser beam to a back side of the wafer along each division line, the second laser beam having a transmission wavelength to the wafer, thereby forming a modified layer inside the wafer along each division line.

12 Claims, 6 Drawing Sheets

WAFER PROCESSING METHOD INCLUDING A TEST ELEMENT GROUP (TEG) CUTTING STEP

BACKGROUND OF THE INVENTION

Field of the Invention

The present invention relates to a wafer processing method for processing a wafer having a test element group (TEG) formed on each division line.

Description of the Related Art

A plurality of devices such as integrated circuits (ICs) and large-scale integrated circuits (LSIs) are formed on a front side of a wafer individually in a plurality of separate regions defined by a plurality of division lines. The wafer thus having the plural devices is divided along the division lines by using a laser processing apparatus, for example. That is, a laser beam is applied to the wafer so as to be focused inside the wafer in an area corresponding to each division line, thereby forming a modified layer inside the wafer along each division line. Thereafter, an external force is applied to the wafer to thereby divide the wafer along the division lines, thus obtaining a plurality of individual device chips individually including the plural devices. The device chips are used in various electrical equipment such as mobile phones and personal computers (see Japanese Patent No. 3408805, for example).

Further, there is a case that a TEG for use in evaluation and analysis of each device is previously formed on each division line, in which the TEG is a group of elements containing metal. In the case of dividing a wafer having such a TEG formed on each division line, it is necessary to apply a laser beam to the wafer in the condition where a focal point of the laser beam is set on an upper surface of each division line, thereby cutting the TEG along each division line.

SUMMARY OF THE INVENTION

In cutting the TEG along each division line by applying a laser beam to the front side of the wafer in the condition where the focal point of the laser beam is set on the TEG, thereby performing ablation, there arises a problem such that debris scatters from the position where the laser beam is applied, causing contamination of a focusing lens.

To cope with this problem, a protective tape is attached to the front side of the wafer, so as to suppress the scattering of the debris, and a laser beam is applied through the protective tape to the front side of the wafer. However, in peeling the protective tape from the front side of the wafer, there arises a problem such that adhesive included in the protective tape may be left on the front side of the wafer, causing a degradation in quality of each device. Particularly in the case of using a laser beam having a transmission wavelength to the wafer (as used in forming a modified layer inside the wafer) to perform the ablation and thereby cut the TEG, the above problem of contamination is prone to occur.

It is therefore an object of the present invention to provide a wafer processing method which can prevent the contamination of a focusing lens with the debris in applying a laser beam to a wafer having a TEG formed on each division line, thereby cutting the TEG, and can also prevent a degradation in quality of each device.

In accordance with an aspect of the present invention, there is provided a wafer processing method for dividing a wafer having a device area on a front side thereof, the device area including a plurality of separate regions where a plurality of devices are individually formed so as to be separated by a plurality of division lines, a TEG being formed on each division line, in which the wafer is divided along the division lines to obtain a plurality of device chips individually including the plurality of devices. The wafer processing method includes: a sheet bonding step of placing a thermoplastic polymer sheet on the front side of the wafer, the thermoplastic polymer sheet having a size capable of covering the device area, and next performing thermocompression bonding to bond the polymer sheet to the front side of the wafer, thereby protecting the front side of the wafer with the polymer sheet; a TEG cutting step of applying a first laser beam through the polymer sheet to the wafer along each division line in a condition where a focal point of the first laser beam is set on each division line, thereby cutting the TEG formed on each division line; a modified layer forming step of applying a second laser beam to a back side of the wafer along each division line in a condition where a focal point of the second laser beam is set inside the wafer in an area corresponding to each division line, the second laser beam having a transmission wavelength to the wafer, thereby forming a modified layer inside the wafer along each division line; and a wafer dividing step of applying an external force to the wafer after performing the TEG cutting step and the modified layer forming step, thereby dividing the wafer along the division lines to obtain the device chips.

Preferably, the wafer processing method further includes a wafer supporting step of supporting the wafer through a dicing tape to an annular frame having an inside opening capable of accommodating the wafer before or after performing the TEG cutting step, the dicing tape being attached to the back side of the wafer and to the annular frame in a condition where the wafer is located in the inside opening of the annular frame; the second laser beam being applied through the dicing tape to the back side of the wafer in the modified layer forming step. Preferably, the wafer processing method further includes a sheet peeling step of peeling the polymer sheet from the front side of the wafer before performing the wafer dividing step. Preferably, the first laser beam to be used in the TEG cutting step is the same as the second laser beam to be used in the modified layer forming step.

Preferably, the thermoplastic polymer sheet is a polyolefin sheet or a polyester sheet.

Preferably, the polyolefin sheet is formed of polyethylene, polypropylene, or polystyrene. In the case that the polyolefin sheet is formed of polyethylene, the polyolefin sheet is preferably heated to a temperature in the range of 120° C. to 140° C. in the sheet bonding step. In the case that the polyolefin sheet is formed of polypropylene, the polyolefin sheet is preferably heated to a temperature in the range of 160° C. to 180° C. in the sheet bonding step. In the case that the polyolefin sheet is formed of polystyrene, the polyolefin sheet is preferably heated to a temperature in the range of 220° C. to 240° C. in the sheet bonding step.

Preferably, the polyester sheet is formed of polyethylene terephthalate or polyethylene naphthalate.

In the case that the polyester sheet is formed of polyethylene terephthalate, the polyester sheet is preferably heated to a temperature in the range of 250° C. to 270° C. in the sheet bonding step. In the case that the polyester sheet is formed of polyethylene naphthalate, the polyester sheet is preferably heated to a temperature in the range of 160° C. to 180° C. in the sheet bonding step.

The wafer processing method of the present invention is a method for dividing a wafer having a device area on the front side thereof. The device area includes a plurality of separate regions where a plurality of devices are individually formed so as to be separated by a plurality of division lines. Further, a TEG is previously formed on each division line. The wafer is divided along the division lines by this method, thereby obtaining a plurality of device chips individually including the plural devices. The wafer processing method includes a sheet bonding step, a TEG cutting step, a modified layer forming step, and a wafer dividing step. In the sheet bonding step, a thermoplastic polymer sheet having a size capable of covering the device area of the wafer is placed on the front side of the wafer, and thermocompression bonding is next performed to bond the polymer sheet to the front side of the wafer, thereby protecting the front side of the wafer with the polymer sheet. In the TEG cutting step, a first laser beam is applied through the polymer sheet to the wafer along each division line in the condition where the focal point of the first laser beam is set on each division line, thereby cutting the TEG formed on each division line. In the modified layer forming step, a second laser beam having a transmission wavelength to the wafer is applied to the back side of the wafer along each division line in the condition where the focal point of the second laser beam is set inside the wafer in an area corresponding to each division line, thereby forming a modified layer inside the wafer along each division line. In the wafer dividing step, an external force is applied to the wafer after performing the TEG cutting step and the modified layer forming step, thereby dividing the wafer along the division lines to obtain the device chips. With this configuration, in applying the first laser beam to the TEG to cut the TEG in the TEG cutting step, scattering of debris generated from the wafer can be suppressed by the polymer sheet bonded to the front side of the wafer in the sheet bonding step, so that contamination of a focusing lens with the debris can be prevented. Further, the polymer sheet is united to the wafer by thermocompression bonding in the sheet bonding step. Accordingly, in peeling the polymer sheet from the front side of the wafer, there is no possibility that adhesive, wax, a liquid resin, or the like, for example, may be left on each device, so that a degradation in quality of each device can be prevented.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the wafer processing method according to the present invention will now be described in detail with reference to the attached drawings.

Figures 1A, 1B:
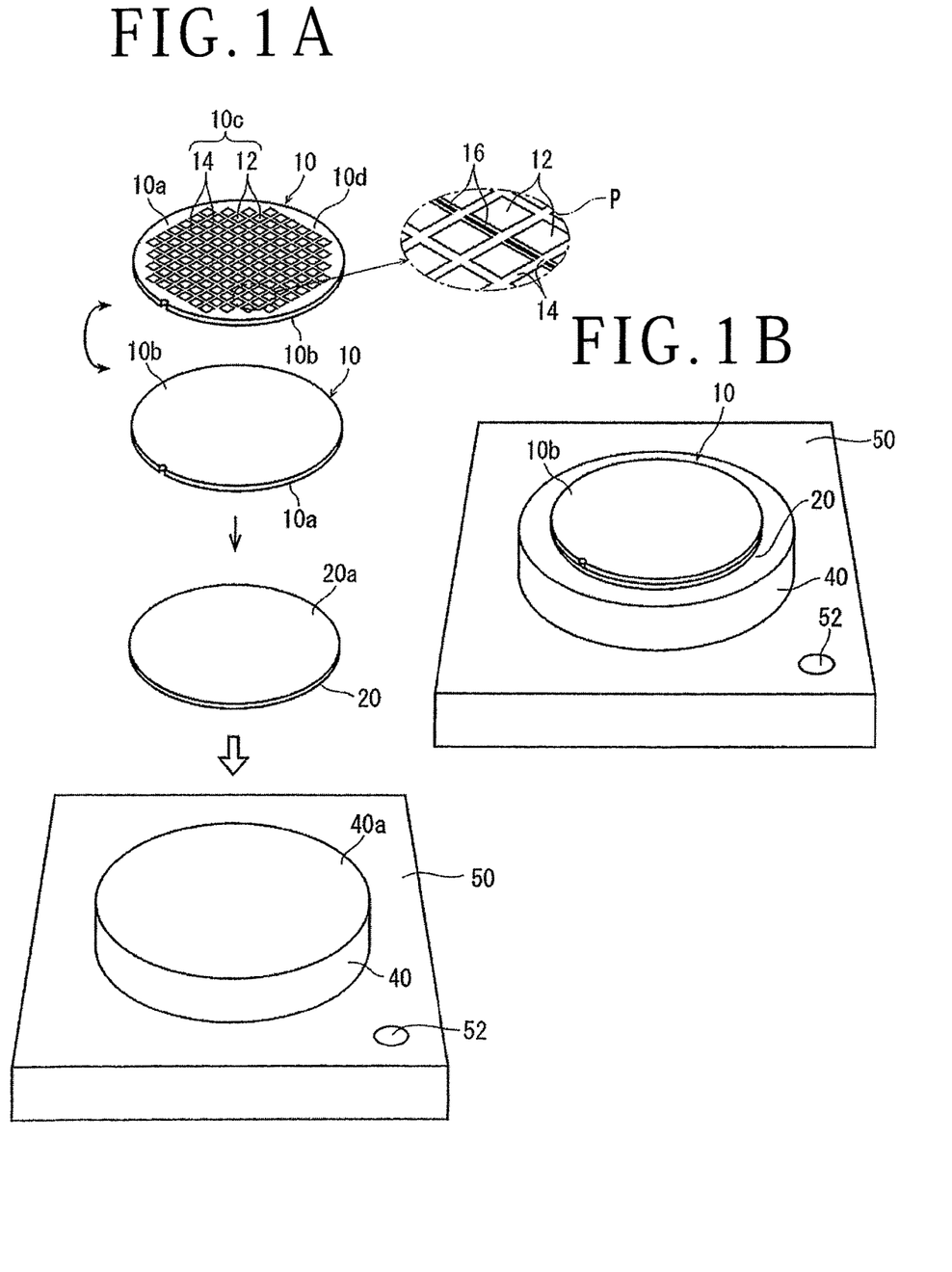
FIG. 1A is a perspective view depicting a manner of placing a sheet on the front side of a wafer in a sheet bonding step according to a preferred embodiment of the present invention.
FIG. 1B is a perspective view depicting a condition where the sheet is placed on the front side of the wafer.

Prior to performing the wafer processing method according to this preferred embodiment, a circular wafer 10 and a circular sheet 20 are prepared as depicted in FIG. 1A. The wafer 10 is formed of silicon carbide (SiC). The wafer 10 has a front side 10a and a back side 10b. A plurality of crossing division lines 14 are formed on the front side 10a of the wafer 10 to thereby define a plurality of separate regions where a plurality of devices 12 are individually formed. The plural division lines 14 are composed of a plurality of parallel division lines extending in a first direction and a plurality of parallel division lines extending in a second direction perpendicular to the first direction. The plural devices 12 and the plural division lines 14 are formed in a central device area 10c on the front side 10a of the wafer 10. The device area 10c is surrounded by a peripheral marginal area 10d where no devices are formed. Further, as depicted in an encircled area P in FIG. 1A, this area P being an enlarged perspective view of a part of the device area 10c of the wafer 10, a TEG 16 as a group of elements for use in evaluation and analysis of each device 12 is formed on a part of each division line 14. The TEG 16 contains metal. The sheet 20 has a front side 20a and a back side 20b. The sheet 20 has substantially the same size (diameter) as that of the wafer 10. The sheet 20 is a thermoplastic polymer sheet such as a polyolefin sheet and a polyester sheet. In this preferred embodiment, a polyethylene (PE) sheet as an example of the polyolefin sheet is selected for the sheet 20. In the present invention, it is not always necessary to make the size of the sheet 20 equal to the size of the wafer 10, but it is sufficient that the sheet 20 has a size capable of covering at least the device area 10c.

(Sheet Bonding Step)

Figure 2A:
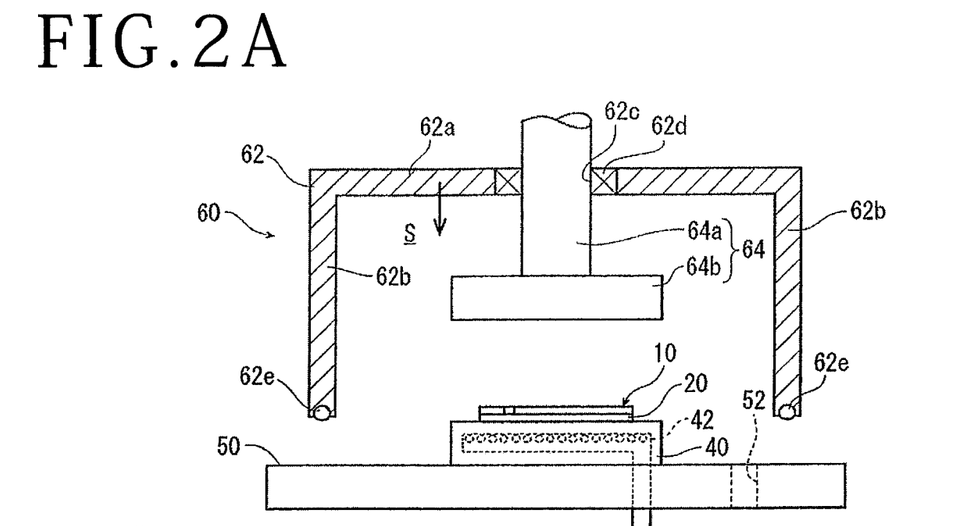
FIGS. 2A, 2B, and 2C are partially sectional side views for illustrating a manner of bonding the sheet to the front side of the wafer by thermocompression bonding in the sheet bonding step.

After preparing the wafer 10 and the sheet 20, a circular support table 40 having a front side 40a is provided on the upper surface of a rectangular base 50 at a central portion thereof in the condition where the front side 40a of the support table 40 is oriented upward as depicted in FIG. 1A. The sheet 20 is placed on the front side 40a of the support table 40 at a central portion thereof in the condition where the front side 20a of the sheet 20 is oriented upward. The diameter of the support table 40 is larger than the diameter of the sheet 20 (see FIG. 1B). Further, the wafer 10 is placed on the front side 20a of the sheet 20 in the condition where the back side 10b of the wafer 10 is oriented upward, that is, the front side 10a of the wafer 10 is oriented downward as depicted in FIG. 1A. At this time, the wafer 10 is aligned with the sheet 20 set on the support table 40. The front side (upper surface) 40a of the support table 40 is flat and it is coated with fluororesin. As depicted in FIG. 2, the support table 40 contains an electric heater 42 as heating means and also contains a temperature sensor (not depicted). The electric heater 42 and the temperature sensor are connected to a control unit and a power source (both not depicted), whereby the temperature of the support table 40 can be adjusted to a desired temperature.

Figure 2B:
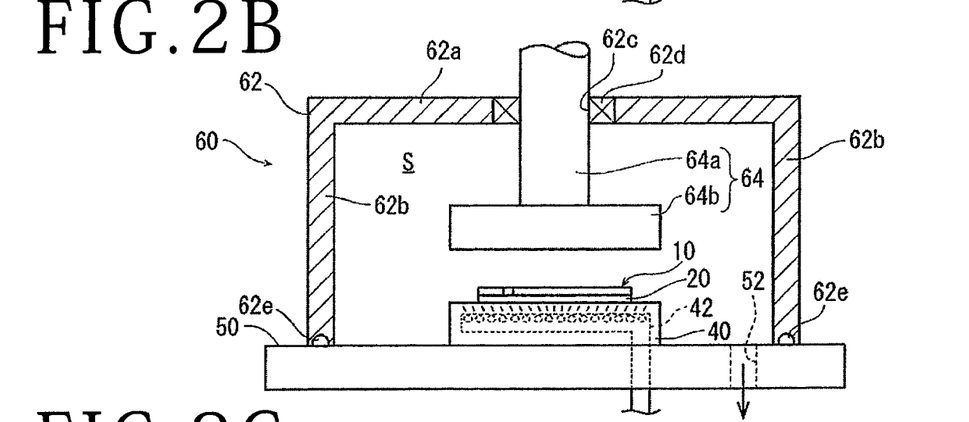
Figure 2C:
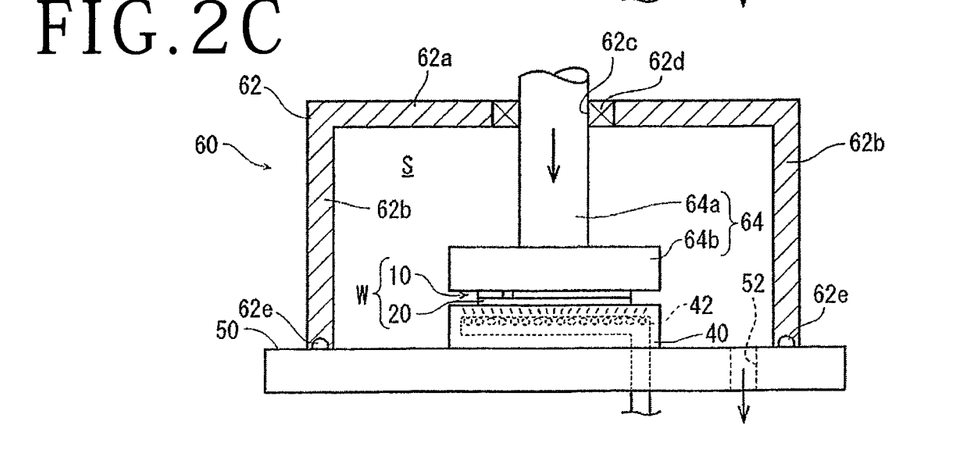

After setting the sheet 20 on the support table 40 and setting the wafer 10 on the sheet 20 in the condition where the back side 10b of the wafer 10 is oriented upward as depicted in FIG. 1B, thermocompression bonding is performed to bond the sheet 20 to the wafer 10 as depicted in FIGS. 2A, 2B, and 2C. This thermocompression bonding will now be described in more detail.

As depicted in FIG. 2A, the thermocompression bonding is performed by using a thermocompression bonding apparatus 60. The thermocompression bonding apparatus 60 includes an enclosing cover member 62 for forming an enclosed environment in cooperation with the base 50 in the condition where the support table 40 is set in the enclosed environment. In FIGS. 2A to 2C, only the enclosing cover member 62 is depicted in vertical section for convenience of illustration of the internal configuration. The enclosing cover member 62 is a box-shaped member configured to cover the whole of the upper surface of the base 50 in such a manner that the wafer 10 and the sheet 20 placed on the support table 40 provided on the base 50 can be surrounded by the enclosing cover member 62. The enclosing cover member 62 has a rectangular upper wall 62a and a rectangular cylindrical side wall 62b extending downward from the outer periphery of the rectangular upper wall 62a. The enclosing cover member 62 is open at its bottom end opposite to the upper wall 62a. The upper wall 62a has a central opening 62c for insertion of a support shaft 64a of a pressure member 64. The support shaft 64a of the pressure member 64 is vertically movably inserted through the central opening 62c of the upper wall 62a. Further, a seal structure 62d is interposed between the support shaft 64a and the upper wall 62a so as to seal the gap therebetween in the central opening 62c. The seal structure 62d allows the vertical movement of the support shaft 64a and the hermetic seal of an inside space S of the enclosing cover member 62 for the formation of the enclosed environment. A pressure applying plate 64b is connected to the lower end of the support shaft 64a. Thus, the pressure member 64 is composed of the support shaft 64a and the pressure applying plate 64b. The pressure applying plate 64b is a circular member essentially having a diameter larger than that of the wafer 10. Preferably, the diameter of the pressure applying plate 64b is set slightly larger than that of the support table 40. Further, an elastic seal member 62e is provided on the lower end surface of the side wall 62b of the enclosing cover member 62 so as to extend over the periphery of the side wall 62b. The elastic seal member 62e functions to seal the inside space S of the enclosing cover member 62 in cooperation with the base 50. Although not depicted, drive means for vertically moving the pressure member 64 is provided above the pressure member 64.

After the wafer 10 is placed through the sheet 20 on the support table 40 set on the base 50 in the condition where the back side 10b of the wafer 10 is oriented upward, an enclosing cover member 62 is positioned above the base 50 so as to surround the support table 40 as depicted in FIG. 2A. Thereafter, the enclosing cover member 62 is lowered until the lower end surface of the side wall 62b comes into abutment against the upper surface of the base 50 as depicted in FIG. 2B. Thus, the enclosing cover member 62 is placed on the upper surface of the base 50 so as to enclose the inside space S in which the wafer 10 and the sheet 20 are set on the support table 40. At this time, the pressure applying plate 64b is positioned above the upper surface of the wafer 10 as depicted in FIG. 2B. When the enclosing cover member 62 is placed on the base 50, the elastic seal member 62e provided on the lower end surface of the side wall 62b comes into close contact with the upper surface of the base 50, thereby effecting hermetic seal. The base 50 has a suction hole 52 in the vicinity of the support table 40. The suction hole 52 is connected to suction means (not depicted) for producing a vacuum. Accordingly, the inside space S defined by the enclosing cover member 62 in cooperation with the base 50 is connected through the suction hole 52 to the suction means.

In this manner, the enclosing cover member 62 is placed on the base 50 to thereby make the inside space S of the enclosing cover member 62 into an enclosed environment as depicted in FIG. 2B. Thereafter, the suction means is operated to suck the air in the inside space S through the suction hole 52, thereby evacuating the inside space S where the wafer 10 is present to obtain a nearly vacuum condition. At the same time, the electric heater 42 contained in the support table 40 is operated to heat the sheet 20 placed on the support table 40 so as to be interposed between the wafer 10 and the support table 40. At this time, the temperature of the support table 40 is controlled by the temperature sensor and the control unit (both not depicted) to heat the sheet 20 to a temperature (120° C. to 140° C.) near the melting point of polyethylene forming the sheet 20 in this preferred embodiment. As heating the sheet 20 as mentioned above, the pressure applying plate 64b is lowered to apply a uniform pressure to the whole upper surface (back side 10b) of the wafer 10 as depicted in FIG. 2C. Since the inside space S where the wafer 10 is present has been evacuated to a nearly vacuum condition, the air left between the wafer 10 and the sheet 20 is sucked off. Further, the sheet 20 has been heated to the above temperature to become soft, thereby increasing the adhesion, so that the wafer 10 is united to the sheet 20 by thermocompression bonding, thereby forming a wafer unit W. That is, the wafer unit W is composed of the wafer 10 and the sheet 20 united together. In this manner, the sheet bonding step is finished. By performing the sheet bonding step, at least the device area 10c formed on the front side 10a of the wafer 10 is covered with the sheet 20. That is, the device area 10c is protected by the sheet 20.

After finishing the sheet bonding step, the operation of the suction means is stopped and the operation of the electric heater 42 is also stopped. Thereafter, the pressure applying plate 64b is raised and the enclosing cover member 62 is also raised. When the temperature of the sheet 20 is lowered to a temperature near room temperature, the wafer unit W can be unloaded from the support table 40. In this preferred embodiment, the upper surface 40a of the support table 40 is coated with fluororesin. Accordingly, even when the sheet 20 is heated to increase its adhesion, the sheet 20 can be easily peeled from the support table 40 after performing the sheet bonding step.

Figure 3:
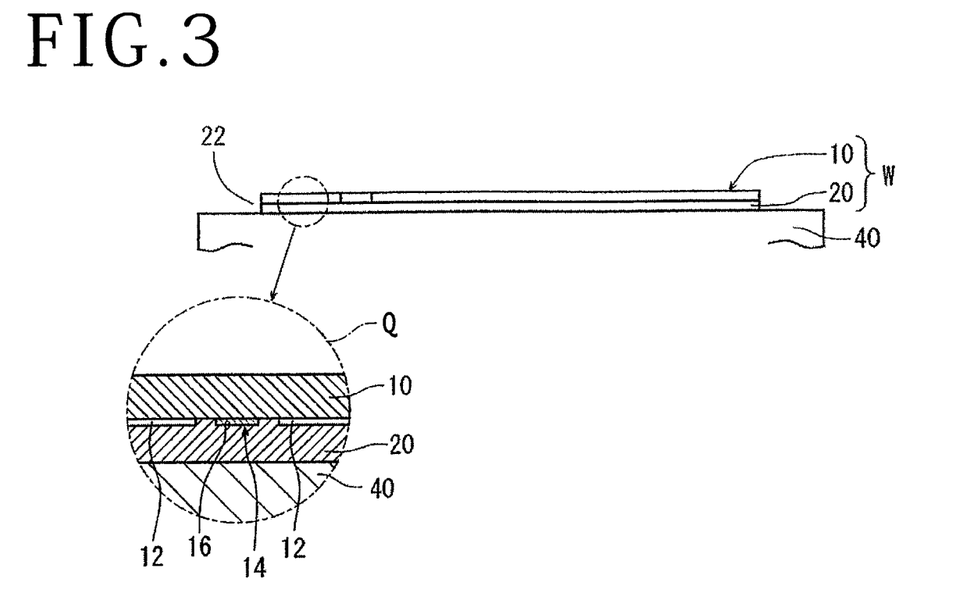
FIG. 3 is a side view of a wafer unit obtained by the sheet bonding step.

The wafer unit W formed by performing the sheet bonding step will now be described in more detail with reference to FIG. 3. As described above, the sheet 20 is heated in an enclosed environment under vacuum and thereby softened in the sheet bonding step. Further, a pressure is applied to the wafer 10 in the condition where the sheet 20 has been softened in the sheet bonding step, so that the wafer 10 is supported to the sheet 20 with a sufficient supporting force without using adhesive or wax, for example. Further, while the TEG 16 is formed on each division line 14 formed on the front side 10a of the wafer 10 in this preferred embodiment, the air left in the vicinity of the TEG 16 can also be completely sucked off in the sheet bonding step. Accordingly, as depicted in an encircled area Q in FIG. 3, the encircled area Q being an enlarged sectional view of a part of the wafer unit W, each device 12 and each TEG 16 can be embedded into the sheet 20 softened by heating, so that the sheet 20 can be tightly bonded to the wafer 10. That is, the wafer 10 and the sheet 20 can be firmly united together to obtain the wafer unit W.

(TEG Cutting Step)

After performing the sheet bonding step, a TEG cutting step is performed to cut the TEG 16 formed on each division line 14. The TEG cutting step will now be described in more detail.

Figure 4:
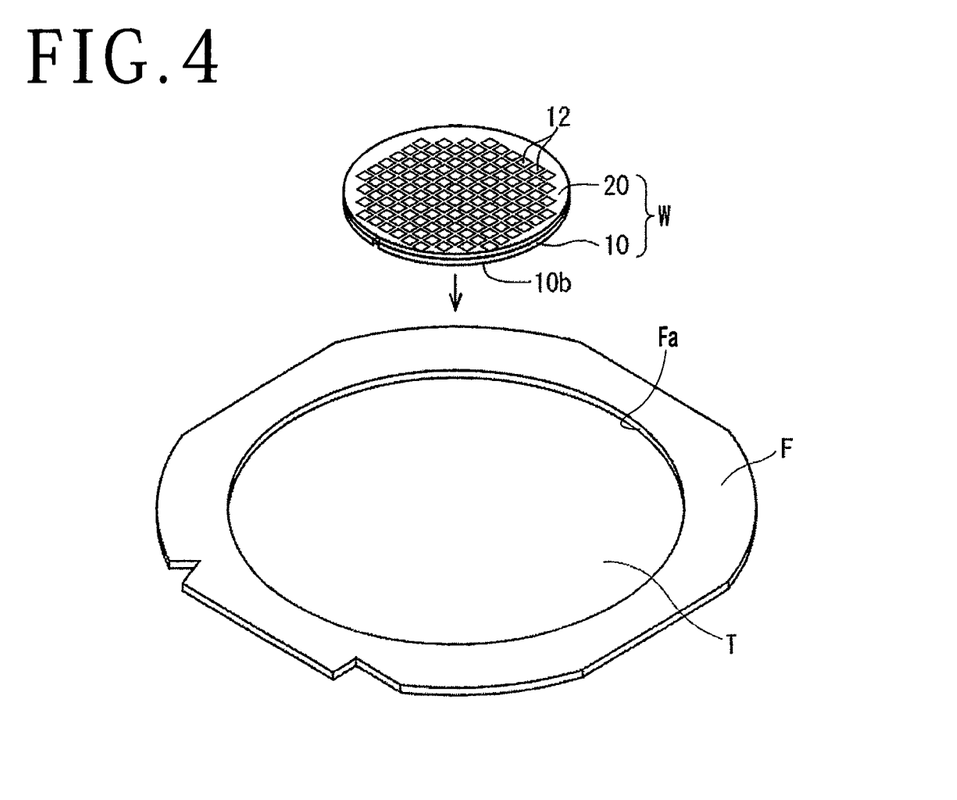
FIG. 4 is a perspective view for illustrating a wafer supporting step according to this preferred embodiment.

Prior to performing the TEG cutting step, the wafer unit W peeled from the support table 40 of the thermocompression bonding apparatus 60 is attached to a dicing tape T in the condition where the back side 10b of the wafer 10 is oriented downward as depicted in FIG. 4. The dicing tape T is a circular adhesive tape, and the wafer unit W is attached to a central portion of the dicing tape T. Further, a peripheral portion of the dicing tape T is attached to an annular frame F having an inside opening Fa for receiving the wafer unit W. Thus, the wafer unit W is supported through the dicing tape T to the annular frame F in the condition where the wafer unit W is located in the inside opening Fa of the annular frame F (wafer supporting step). That is, the wafer unit W is attached to the dicing tape T in the condition where the sheet 20 bonded to the front side 10a of the wafer 10 is oriented upward, or exposed upward.

Figure 5A:
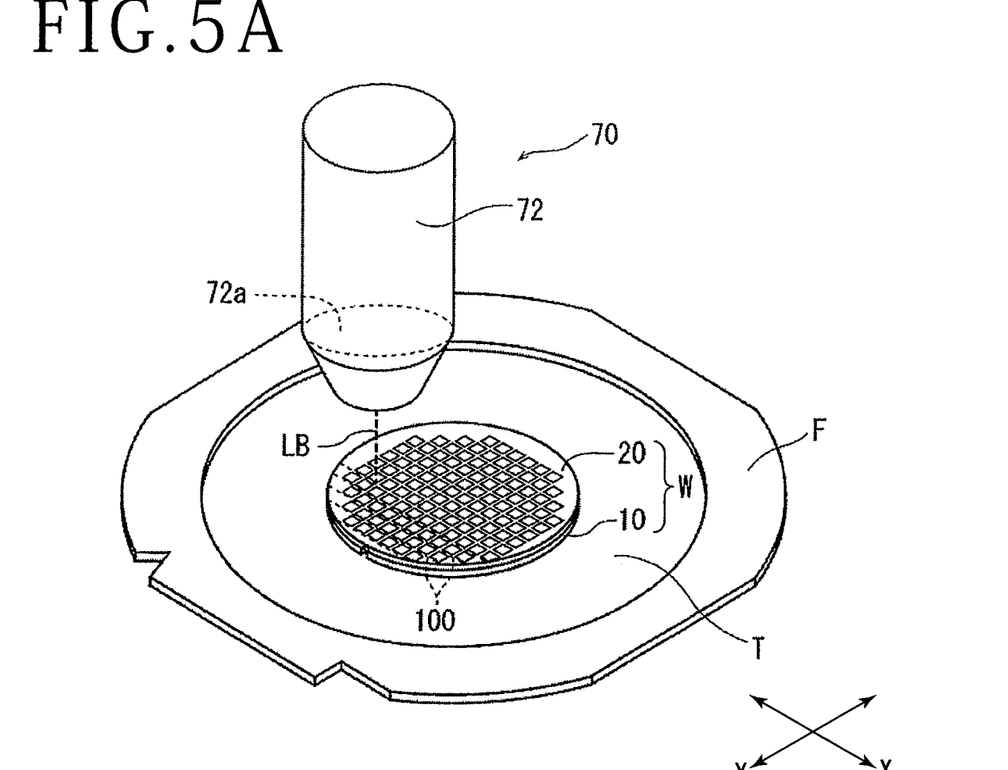
FIG. 5A is a perspective view for illustrating a TEG cutting step according to this preferred embodiment.

After performing the wafer supporting step, the wafer unit W supported through the dicing tape T to the annular frame F is transferred to a known laser processing apparatus 70 depicted in FIG. 5A. In FIG. 5A, a part of the laser processing apparatus 70 is depicted. The laser processing apparatus 70 includes holding means (not depicted) for holding the wafer unit W supported through the dicing tape T to the annular frame F in the condition where the dicing tape T is oriented downward, that is, the sheet 20 is oriented upward. The laser processing apparatus 70 further includes alignment means (not depicted) including an imaging camera for imaging the wafer 10 and laser beam applying means 72 for applying a laser beam LB to the wafer 10. In the condition where the wafer unit W supported through the dicing tape T to the annular frame F is held by the holding means, alignment is performed by the alignment means. That is, the focus position of the laser beam LB to be applied from the laser beam applying means 72 is aligned to a predetermined one of the division lines 14 extending in the first direction on the wafer 10.

Figure 5B:
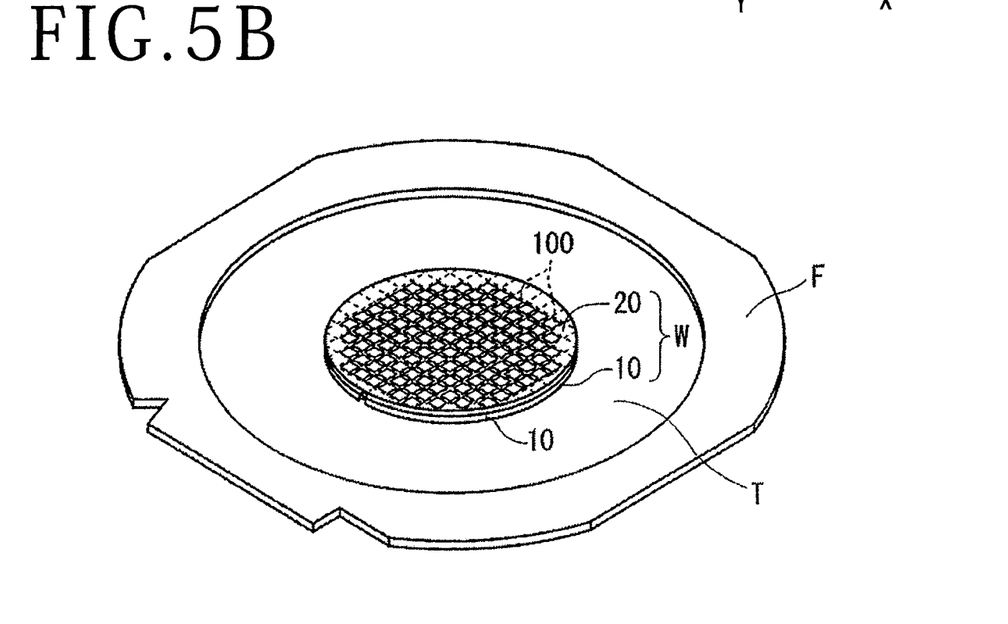
FIG. 5B is a perspective view depicting a condition obtained by the TEG cutting step.

After performing the above alignment, the focal point of the laser beam LB to be focused by a focusing lens 72a provided in the laser beam applying means 72 is set at a predetermined start position on the predetermined division line 14 (e.g., at one end of the predetermined division line 14) on the wafer 10. By performing the alignment, the division lines 14 extending in the first direction are made parallel to the X direction depicted by an arrow X in FIG. 5A. Thereafter, the laser beam LB is applied from the laser beam applying means 72 to the wafer 10, and at the same time, the holding means holding the wafer unit W is moved in the X direction by moving means (not depicted). Accordingly, the laser beam LB is applied through the sheet 20 to the wafer 10 along the predetermined division line 14. That is, ablation is performed along the predetermined division line 14 to form a laser processed groove 100 as depicted in FIG. 5A. At the same time, the TEG 16 formed on the predetermined division line 14 is cut by the laser processed groove 100. Thereafter, the holding means is moved by the moving means in the Y direction, and the laser beam LB is similarly applied along all of the other division lines 14 extending in the first direction. Thereafter, the holding means is rotated 90 degrees to similarly apply the laser beam LB along all of the other division lines 14 extending in the second direction perpendicular to the first direction. As a result, a plurality of laser processed grooves 100 are similarly formed along all of the crossing division lines 14 formed on the front side 10a of the wafer 10 as depicted in FIG. 5B, thereby cutting all the TEGs 16 formed on all the crossing division lines 14. In this manner, the laser beam LB is applied through the sheet 20 to the front side 10a of the wafer 10 along each division line 14 in the TEG cutting step in which the sheet 20 has been bonded to the wafer 10 by thermocompression bonding. Accordingly, scattering of debris generated from the wafer 10 in performing the ablation can be prevented by the sheet 20, thereby suppressing contamination of the focusing lens 72a. Thus, the TEG cutting step is finished.

For example, the laser processing in the TEG cutting step is performed under the following conditions.

Wavelength: 1064 nm
Repetition frequency: 60 kHz
Average power: 1 W
Feed speed: 600 mm/s After performing the TEG cutting step, a modified layer forming step is performed to form a modified layer inside the wafer 10. The modified layer forming step will now be described in more detail.

(Modified Layer Forming Step)

Figure 6:
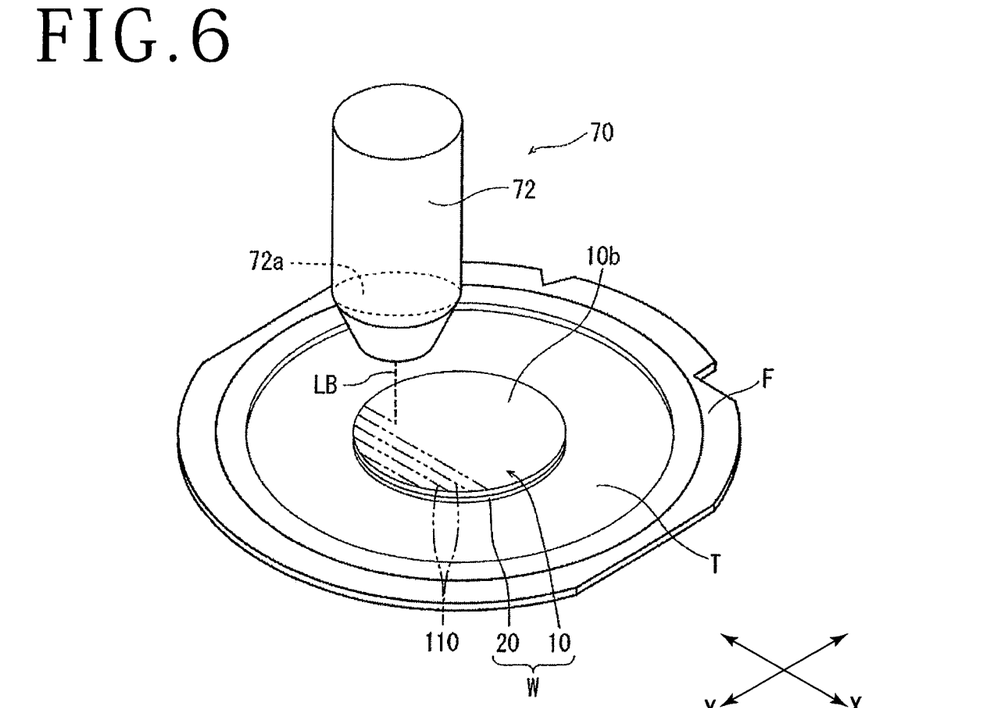
FIG. 6 is a perspective view for illustrating a modified layer forming step according to this preferred embodiment.

The modified layer forming step in this preferred embodiment may be performed by using the laser processing apparatus 70 mentioned above. After performing the TEG cutting step, the wafer unit W supported through the dicing tape T to the annular frame F is once removed from the holding means. Then, as depicted in FIG. 6, the wafer unit W supported through the dicing tape T to the annular frame F is inverted, so that the wafer unit W is oriented downward and the dicing tape T is oriented upward. Thereafter, the wafer unit W thus inverted is held again by the holding means. After holding the wafer unit W on the holding means, the alignment means is operated to make the alignment between the laser applying position of the laser beam LB and a predetermined one of the division lines 14 extending in the first direction on the wafer 10. As depicted in FIG. 6, in the modified layer forming step, the laser beam LB is applied through the dicing tape T to the back side 10b of the wafer 10 in the condition where the front side 10a of the wafer 10 is oriented downward. Accordingly, the alignment means includes infrared light applying means and infrared imaging means for imaging the division lines 14 from the back side 10b of the wafer 10 by using infrared light.

After performing the alignment, the laser beam applying means 72 is operated to position the focal point of the laser beam LB inside the wafer 10 in an area corresponding to the predetermined division line 14. Thereafter, the laser beam LB is applied through the dicing tape T to the back side 10b of the wafer 10. At the same time, the holding means holding the wafer unit W is moved in the X direction depicted by an arrow X in FIG. 6. By performing the alignment, the predetermined division line 14 extending in the first direction is made parallel to the X direction. As indicated in the laser processing conditions described above, the laser beam LB to be applied from the laser beam applying means 72 has a transmission wavelength (=1064 nm) to SiC forming the wafer 10, so that a modified layer 110 as a division start point is formed inside the wafer 10 along the predetermined division line 14 by applying the laser beam LB to the wafer 10. Thereafter, the holding means is moved in the Y direction depicted by an arrow Y in FIG. 6 to similarly form a plurality of modified layers 110 inside the wafer 10 along all of the other division lines 14 extending in the first direction. Thereafter, the holding means is rotated 90 degrees to similarly form a plurality of modified layers 110 inside the wafer 10 along all of the other division lines 14 extending in the second direction perpendicular to the first direction. As a result, the plural modified layers 110 are formed inside the wafer 10 along all of the crossing division lines 14 formed on the front side 10a of the wafer 10. Thus, the modified layer forming step is finished.

(Wafer Dividing Step)

After performing the modified layer forming step, a wafer dividing step is performed to divide the wafer 10 into individual device chips (the devices 12) by applying an external force to the wafer 10. The wafer dividing step will now be described in more detail.

Figure 7:
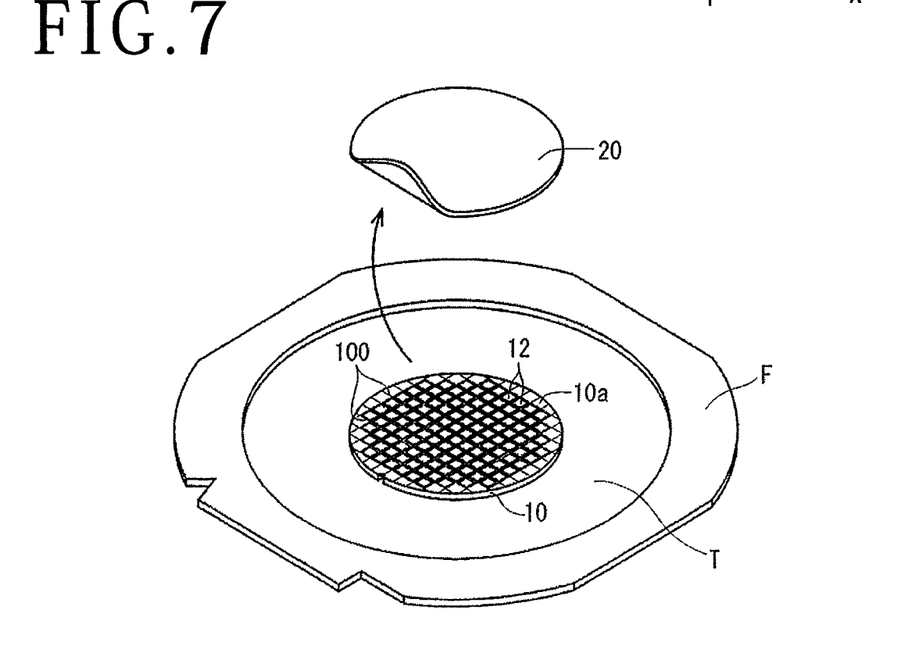
FIG. 7 is a perspective view for illustrating a sheet peeling step according to this preferred embodiment.

Prior to performing the wafer dividing step, a sheet peeling step is performed to peel the sheet 20 from the wafer 10 supported through the dicing tape T to the annular frame F as depicted in FIG. 7. In peeling the sheet 20, the sheet 20 is preferably heated to be softened, so that the sheet 20 can be peeled more easily. Further, there is a case that the adhesion of the sheet 20 is reduced by cooling the sheet 20, according to the material of the sheet 20. In this case, the sheet 20 may be cooled to reduce its adhesion in the sheet peeling step. Accordingly, whether the sheet 20 is to be heated or to be cooled may be selected according to the characteristics of the material of the sheet 20. In this preferred embodiment, the wafer 10 is supported to the sheet 20 by thermocompression bonding. That is, a liquid resin, adhesive, or wax, for example, is absent between the sheet 20 and the wafer 10. Accordingly, in peeling the sheet 20 from the front side 10a of the wafer 10, there is no possibility that such a liquid resin, adhesive, or wax may be left on each device 12, thereby preventing a degradation in quality of each device 12.

Figure 8:
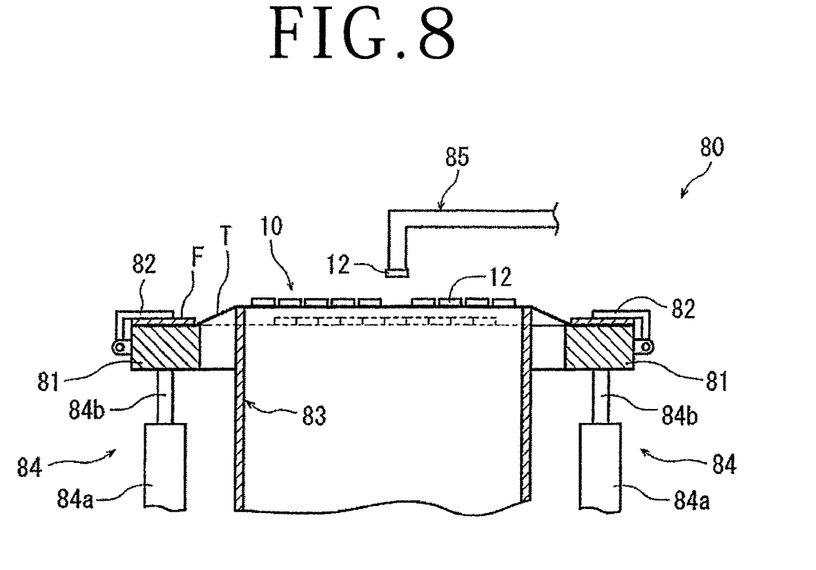
FIG. 8 is a partially sectional side view for illustrating a wafer dividing step according to this preferred embodiment.

After peeling the sheet 20 from the wafer 10, the wafer 10 supported through the dicing tape T to the annular frame F is transferred to a dividing apparatus 80 for performing the wafer dividing step as depicted in FIG. 8. The wafer dividing step using the dividing apparatus 80 will now be described in more detail.

The wafer dividing step is performed by the dividing apparatus 80, a part of which is depicted in vertical section in FIG. 8. The dividing apparatus 80 includes a frame holding member 81 having an annular shape, a plurality of clamps 82 provided on the outer circumference of the frame holding member 81 for clamping the annular frame F placed on the upper surface of the frame holding member 81, and a cylindrical expansion drum 83 surrounded by the frame holding member 81 for expanding the dicing tape T attached to the annular frame F held by the clamps 82. The expansion drum 83 is open at its upper end. The frame holding member 81 is vertically movably supported by a plurality of supporting means 84 arranged around the expansion drum 83. Each supporting means 84 is composed of an air cylinder 84a and a piston rod 84b extending upward from the air cylinder 84a. The upper end of each piston rod 84b is fixed to the lower surface of the frame holding member 81. Accordingly, when each air cylinder 84a is operated to vertically move each piston rod 84b, the frame holding member 81 is vertically moved by each piston rod 84b.

The expansion drum 83 has an outer diameter smaller than the inner diameter of the annular frame F and has an inner diameter larger than the diameter of the wafer 10 supported through the dicing tape T to the annular frame F. Accordingly, the upper end of the expansion drum 83 is positioned below an annular exposed area of the dicing tape T as defined between the wafer 10 and the annular frame F. The frame holding member 81 is adapted to be vertically moved by the supporting means 84 so as to take an initial position where the upper surface of the frame holding member 81 is at substantially the same level as that of the upper end of the expansion drum 83 as depicted by a broken line in FIG. 8 and an operative position where the frame holding member 81 is lowered from the initial position to thereby obtain a condition that the upper end of the expansion drum 83 is relatively higher in level than the upper surface of the frame holding member 81 as depicted by a solid line in FIG. 8.

When the frame holding member 81 is lowered from the initial position to thereby relatively change the position of the upper end of the expansion drum 83 from the position depicted by the broken line to the position depicted by the solid line, the dicing tape T supported to the annular frame F is expanded by the upper end of the expansion drum 83. That is, the dicing tape T is an expandable tape adapted to be expanded by applying a tensile force thereto. As a result, an external force (tensile force) is applied to the wafer 10 attached to the dicing tape T in its radially outward direction. Accordingly, the wafer 10 is divided along each division line 14 where the laser processed groove 100 has been formed in the TEG cutting step and the modified layer 110 has been formed in the modified layer forming step, thereby obtaining a plurality of device chips individually including the plural devices 12. Thus, the wafer dividing step is finished.

By performing the wafer dividing step, the wafer 10 is divided into the plural device chips individually including the plural devices 12 in the condition where any adjacent ones of the device chips are spaced from each other on the dicing tape T. In this condition, a pickup collet 85 is operated to hold each device chip under suction and then separate each device chip from the dicing tape T. Thereafter, each device chip is transferred to any apparatus for performing the next step or stored into a storing case. Thus, the wafer processing method in this preferred embodiment is completed.

While the dividing apparatus 80 is used to apply an external force to the wafer 10 in its radially outward direction and thereby divide the wafer 10 into the individual device chips in the above preferred embodiment, means for applying an external force to the wafer 10 to divide the wafer 10 into the individual device chips is not limited to the above. For example, a wedge-shaped member may be used to push the wafer 10 along each division line 14, thereby applying an external force to the wafer 10 to divide the wafer 10 along each division line 14. As another example, roller-shaped pressure applying means may be used to press the wafer 10 from above, thereby applying an external force to the wafer 10 to divide the wafer 10 along each division line 14.

The TEG cutting step in this preferred embodiment employs the same laser beam as the laser beam to be applied in the modified layer forming step. In the TEG cutting step, the focal point of the laser beam is set on the upper surface of each division line 14 to perform ablation, thereby cutting the TEG formed on each division line 14. That is, it is unnecessary to prepare any dedicated laser beam applying means for performing the TEG cutting step in addition to the laser beam applying means 72 for performing the modified layer forming step, thereby achieving good economy. However, the present invention is not limited to this configuration. That is, additional laser beam applying means capable of applying a laser beam having another wavelength allowing the cut of the TEG may be prepared to perform the TEG cutting step.

While the wafer supporting step of supporting the wafer 10 through the dicing tape T to the annular frame F is performed before performing the TEG cutting step in this preferred embodiment, the wafer supporting step may be performed after performing the TEG cutting step.

While the sheet 20 is a polyethylene sheet in this preferred embodiment, the present invention is not limited to this configuration. That is, the sheet 20 capable of protecting the front side 10*a* of the wafer 10 by thermocompression bonding without the need for a liquid resin, adhesive, or wax, for example, may be suitably selected from a polyolefin sheet and a polyester sheet. Examples of the polyolefin sheet include a polyethylene (PE) sheet, a polypropylene (PP) sheet, and a polystyrene (PS) sheet. Further, examples of the polyester sheet include a polyethylene terephthalate (PET) sheet and a polyethylene naphthalate (PEN) sheet.

In this preferred embodiment, the sheet 20 is heated to a temperature (120° C. to 140° C.) near the melting point of polyethylene in the sheet bonding step by thermocompression bonding. However, in the case that the sheet 20 is any thermoplastic polymer sheet other than a polyethylene sheet, the sheet 20 is preferably heated to a temperature near the melting point of the material of the selected sheet. For example, in the case that the sheet 20 is a polypropylene sheet, the sheet 20 is preferably heated to a temperature in the range of 160° C. to 180° C. near the melting point of polypropylene in the sheet bonding step. In the case that the sheet 20 is a polystyrene sheet, the sheet 20 is preferably heated to a temperature in the range of 220° C. to 240° C. near the melting point of polystyrene in the sheet bonding step. Further, in the case that the sheet 20 is a polyethylene terephthalate sheet, the sheet 20 is preferably heated to a temperature in the range of 250° C. to 270° C. near the melting point of polyethylene terephthalate in the sheet bonding step. In the case that the sheet 20 is a polyethylene naphthalate sheet, the sheet 20 is preferably heated to a temperature in the range of 160° C. to 180° C. near the melting point of polyethylene naphthalate in the sheet bonding step.

Figure 9A:
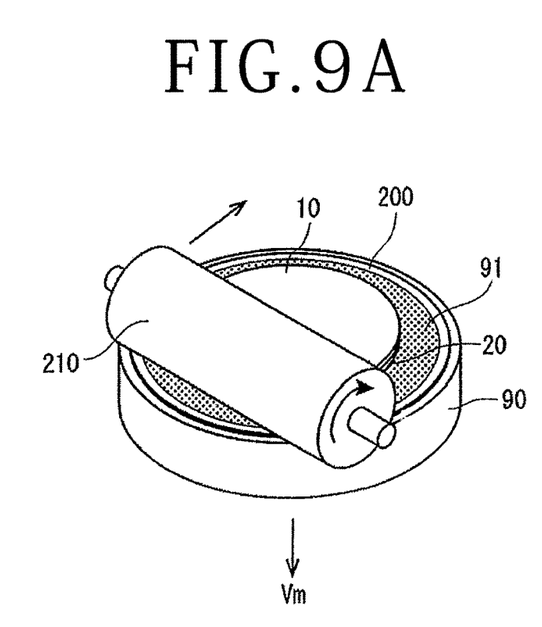
FIG. 9A is a perspective view depicting a modification of the sheet bonding step.
Figure 9B:
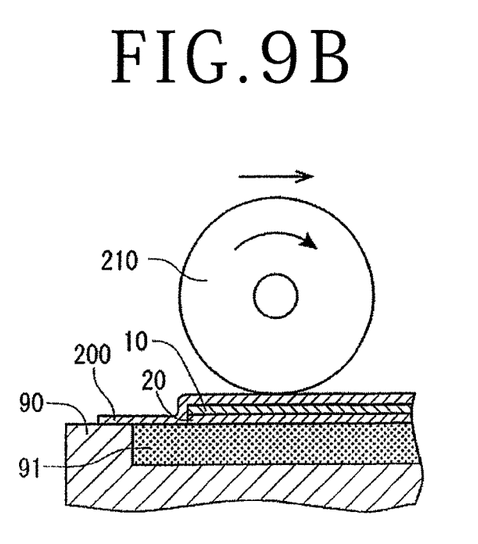
FIG. 9B is an enlarged sectional view of an essential part of the configuration shown in FIG. 9A.

While the enclosing cover member 62 is used to form an enclosed environment in this preferred embodiment, the present invention is not limited to this configuration. For example, a modification may be made as depicted in FIGS. 9A and 9B. In this modification, holding means 90 having a vacuum chuck 91 is used, in which the vacuum chuck 91 has a diameter larger than that of the sheet 20. The wafer 10 is held through the sheet 20 on the vacuum chuck 91 of the holding means 90. Furthermore, the whole upper surface of the vacuum chuck 91 holding the wafer 10 and the sheet 20 is covered with a film member 200. That is, all of the wafer 10, the sheet 20, and the exposed upper surface of the vacuum chuck 91 are fully covered with the film member 200. In this condition, suction means (not depicted) is operated to apply a vacuum Vm to the vacuum chuck 91 as depicted in FIG. 9A, thereby evacuating the inside space of an environment formed by the film member 200 in cooperation with the upper surface of the vacuum chuck 91. FIG. 9B is an enlarged sectional view of an essential part of the configuration depicted in FIG. 9A. As depicted in FIG. 9B, a roller 210 including heating means (not depicted) is used to apply a pressure to the whole of the back side 10*b* of the wafer 10 through the film member 200 as heating the sheet 20 to a desired temperature, thereby performing thermocompression bonding of the sheet 20 to the wafer 10 in the sheet bonding step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer having a device area on a front side thereof, the device area including a plurality of separate regions where a plurality of devices are individually formed so as to be separated by a plurality of division lines, a test element group being formed on each division line, in which the wafer is divided along the division lines to obtain a plurality of device chips individually including the plurality of devices, the wafer processing method comprising:
   a sheet bonding step of placing a thermoplastic polymer sheet on the front side of the wafer, the thermoplastic polymer sheet having a size capable of covering the device area, and next performing thermocompression bonding to bond the thermoplastic polymer sheet to the front side of the wafer, thereby protecting the front side of the wafer with the thermoplastic polymer sheet;
   a test element group cutting step of applying a first laser beam through the thermoplastic polymer sheet to the wafer along each division line in a condition where a focal point of the first laser beam is set on each division line, thereby cutting the test element group formed on each division line;
   a modified layer forming step of applying a second laser beam to a back side of the wafer along each division line in a condition where a focal point of the second laser beam is set inside the wafer in an area corresponding to each division line, the second laser beam having a transmission wavelength to the wafer, thereby forming a modified layer inside the wafer along each division line; and
   a wafer dividing step of applying an external force to the wafer after performing the test element group cutting step and the modified layer forming step, thereby dividing the wafer along the division lines to obtain the device chips.

2. The wafer processing method according to claim 1, further comprising:
   a wafer supporting step of supporting the wafer through a dicing tape to an annular frame having an inside opening capable of accommodating the wafer, before or after performing the test element group cutting step, the dicing tape being attached to the back side of the wafer and to the annular frame in a condition where the wafer is located in the inside opening of the annular frame,
   the second laser beam being applied through the dicing tape to the back side of the wafer in the modified layer forming step.

3. The wafer processing method according to claim 1, further comprising:

a sheet peeling step of peeling the thermoplastic polymer sheet from the front side of the wafer before performing the wafer dividing step.

4. The wafer processing method according to claim 1, wherein the first laser beam to be used in the test element group cutting step is the same as the second laser beam to be used in the modified layer forming step.

5. The wafer processing method according to claim 1, wherein the thermoplastic polymer sheet is formed of a material selected from the group consisting of polyolefin and polyester.

6. The wafer processing method according to claim 5, wherein the thermoplastic polymer sheet comprises a polyolefin sheet formed of a material selected from the group consisting of polyethylene, polypropylene, and polystyrene.

7. The wafer processing method according to claim 6, wherein the polyolefin sheet is formed of polyethylene, and the polyolefin sheet is heated to a temperature in the range of 120° C. to 140° C. in the sheet bonding step.

8. The wafer processing method according to claim 6, wherein the polyolefin sheet is formed of polypropylene, and the polyolefin sheet is heated to a temperature in the range of 160° C. to 180° C. in the sheet bonding step.

9. The wafer processing method according to claim 6, wherein the polyolefin sheet is formed of polystyrene, and the polyolefin sheet is heated to a temperature in the range of 220° C. to 240° C. in the sheet bonding step.

10. The water processing method according to claim 5, wherein the thermoplastic polymer sheet comprises a polyester sheet formed of a material selected from the group consisting of polyethylene terephthalate and polyethylene naphthalate.

11. The wafer processing method according to claim 10, wherein the polyester sheet is formed of polyethylene terephthalate, and the polyester sheet is heated to a temperature in the range of 250° C. to 270° C. in the sheet bonding step.

12. The wafer processing method according to claim 10, wherein the polyester sheet is formed of polyethylene naphthalate, and the polyester sheet is heated to a temperature in the range of 160° C. to 180° C. in the sheet bonding step.

* * * * *